United States Patent
Ting et al.

(10) Patent No.: US 7,519,937 B2
(45) Date of Patent: Apr. 14, 2009

(54) CIRCUIT DIAGRAM PROCESSING SYSTEM AND METHOD

(75) Inventors: Wei-Fan Ting, Taipei (TW); Tzu-Chi Chen, Taipei (TW)

(73) Assignee: Inventec Corporation (TW)

( * ) Notice: Subject to any disclaimer, the term of this patent is extended or adjusted under 35 U.S.C. 154(b) by 376 days.

(21) Appl. No.: 11/395,066

(22) Filed: Mar. 30, 2006

(65) Prior Publication Data

US 2007/0234241 A1    Oct. 4, 2007

(51) Int. Cl.
*G06F 17/50* (2006.01)

(52) U.S. Cl. .................. 716/15; 716/1; 716/10

(58) Field of Classification Search ............ 716/1, 716/4–6, 10–15
See application file for complete search history.

(56) References Cited

U.S. PATENT DOCUMENTS 5,781,447 A * 7/1998 Gerdes ................. 716/15
7,322,019 B2 * 1/2008 Sato et al. ............. 716/10

* cited by examiner

*Primary Examiner*—Vuthe Siek
(74) *Attorney, Agent, or Firm*—Peter F. Corless; Steven M. Jensen; Edwards Angell Palmer & Dodge LLP

(57) ABSTRACT

A data processing system and method is proposed. The data processing system is connected with a component library and an original design database. The component library includes component data including part numbers and attributes of components while the original design database stores original design data of pins, nets and codes containing part numbers of components on a circuit diagram. A setting module allows users to set instructions of the original design data to be extracted, and then a data extracting module extracts data of pins, nets and codes of components from the original design database based on these instructions, so that a data processing module may analyze and associate the data extracted by the data extracting module with the component data in the component library and integrates the associated data to create an integrated data required by the user.

7 Claims, 6 Drawing Sheets

| Type | Value_in_symbol | Signal_Model |
|---|---|---|
| R | 0R | R2_60XXXXXXXXXX_0 |
| R | 56H | R2_60XXXXXXXXXX_56 |
| R | 0R | R2_60XXXXXXXXXX_0 |
| C | 70 | C2_60XXXXXXXXXX_70P |
| L | XXX | L2_60XXXXXXXXXX_10N |
| L | 50OHM | L2_60XXXXXXXXXX_50OHM |

FIG. 4

CIRCUIT DIAGRAM PROCESSING SYSTEM AND METHOD

FIELD OF THE INVENTION

The present invention relates to a data processing system and method, and more particularly, to a data processing system and method that processes an original design data generated during designing of a circuit diagram of a Printed Circuit Board (PCB).

BACKGROUND OF THE INVENTION

For a PCB (Printed Circuit Board) design, usually a logic designer designs a circuit diagram according to the PCB design needs, and then a layout engineer in the Layout Department performs PCB layout based on the circuit diagram designed by the logic designer, thereafter, the PCB design after layout is then handed over to a production line for PCB manufacturing.

In order to accommodate electrical design needs, it is well known in the PCB design that at least one passive component such as a resistor, a capacitor, an inductor and so on is required to be disposed between two ICs (Integrated Circuits). FIG. 1 depicts a partial circuit schematic when designing a PCB circuit using Cadence design software. As shown, a pin of a component IC1 is connected to a resistor R via a signal line Net1 while a pin of a component IC2 is connected to the resistor R via a signal line Net2, such that the component IC1 is electrically connected to the component IC2 via the signal line Net1, the resistor R, and the signal line Net2. As shown, signal lines Net1 and Net2 forms a new electrical path via the resistor R, in the industry this electrical path is often called a XNet (if a XNet is present, it means that a passive component exists in the circuit). However, there are many types of passive components. For example, the resistor R shown in FIG. 1 is a 2-pin resistor, the attribute description of which is simple, but for a multi-pin resistor (i.e. a resistor network), the number of pins are large and the attribute description of which is complicated. In the Cadence design software, software called ESPICE is available for designing passive component models, which are stored in a component library. Each of the passive components has a certain definition format so as to facilitate the layout engineers in identifying each of them.

In the process of establishing passive component models, the attribute parameters of each passive component are manually inputted by the layout engineers via an input interface. The attribute parameters may include component type (Type), component value (Value_in_Symbol) and component signal model, wherein the component signal model may include pin count, part number and so on. In addition, attribute parameters of the nets for electrically connecting components are also defined, such as Net name, length, width, pitch etc. Thereafter, the layout engineers can perform layout based on component library information, attribute parameters of the nets and the original design data (which are mainly stored in three files: pstchip.dat (related to pin information), pstxnet.dat (related to net information) and pstxprt.dat (related to part information)) created by the logic designer during designing the circuit diagram according to the PCB design needs.

Since the attribute parameters above are all inputted manually, and the number of components used in a PCB design is usually very large (up to thousands), inputting these data one by one manually is very time consuming and severely hinders the progress and efficiency of PCB design. It is also very tiresome for layout engineers to input many data manually, mistakes can easily be made, such as data misses or extra data added, especially miss of component signal model may result in unrecoverable fault in the subsequent design.

Thus, there is a need for a data processing system and method for saving time and enhancing work efficiency and progress while avoiding the abovementioned human errors as a result of manual operation as in the prior art.

SUMMARY OF THE INVENTION

In the light of forgoing drawbacks, an objective of the present invention is to provide a data processing system and method that realizes fast processing, enhances work efficiency, and saves time in an automatic manner.

Another objective of the present invention is to provide a data processing system and method for avoiding human errors often occur in the prior art due to manually input component data.

In accordance with the above and other objectives, the present invention provides a data processing system and method. The data processing system may be connected with a component library and an original design database. The component library may include component data including part numbers and attributes of components while the original design database may store original design data of pins, nets and codes containing part numbers of components on a circuit diagram. The data processing system may include: a setting module for allowing users to set instructions of the original design data to be extracted; a data extracting module for extracting data of pins, nets and codes of components from the original design database based on these instructions; and a data processing module for analyzing and associating the data extracted by the data extracting module with the component data in the component library and integrating the associated data to create an integrated data required by the user.

The above data processing module may include: an analysis unit for analyzing the data extracted by the data extracting module; an associating unit for associating the data extracted by the data extracting module with the corresponding component data in the component library based on the analyzed result of the analysis unit; and an integrating unit for integrating the data after association by the associating unit to create the integrated data required by the user.

The data processing system of the present invention may further include a prompting module for generating a prompt to the user when the data processing module unable to associate the data extracted by the data extracting module with the component data in the component library, wherein the prompt may indicate that at least one error occurs in at least one of the part numbers and attributes of the component data in the component library.

The above component attributes may include types, values, and pin attributes of the various components on the circuit diagram.

The data processing method of the present invention can be applied in the data processing system. The data processing method comprises the steps of: allowing a user to set instructions of the original design data to be extracted; extracting data of pins, nets and codes of components from the original design database according to the instructions set by the user; and analyzing and associating the data extracted with the component data in the component library and integrating the associated data to create an integrated data required by the user.

The data processing method of the present invention further comprises generating a prompt to the user when associating the data extracted with the component data in the component library fails, wherein the prompt may indicate that at least one error occurs in at least one of the part numbers and attributes of the component data in the component library.

Therefore, the present invention realizes a data processing system and method that, without the need to manually input a long list of component data, processes and integrates required data in an efficient manner. Furthermore, the data processing system and method of the present invention eliminates human errors such as data misses, extra data added or wrong data that often happen in the prior art.

BRIEF DESCRIPTION OF THE DRAWINGS

The present invention can be more fully understood by reading the following detailed description of the preferred embodiments, with reference made to the accompanying drawings, wherein:

FIG. 4 is an example of integrated data that shows attribute parameters information of passive components R, C, L in a component library as a result of applying the data processing system and method of the present invention.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 1:
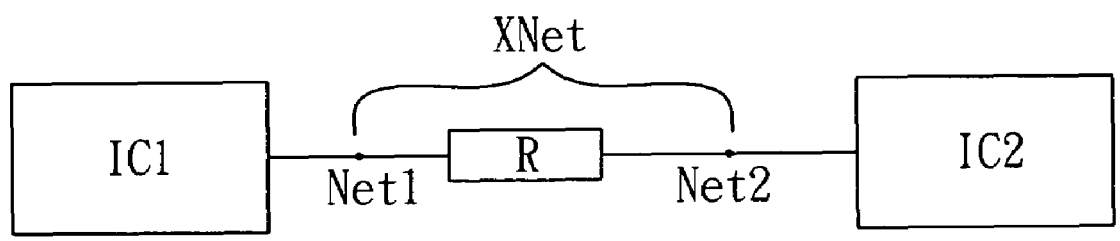
FIG. 1 shows a conventional partial circuit schematic during PCB circuit design using the Cadence design software.
Figure 2A:
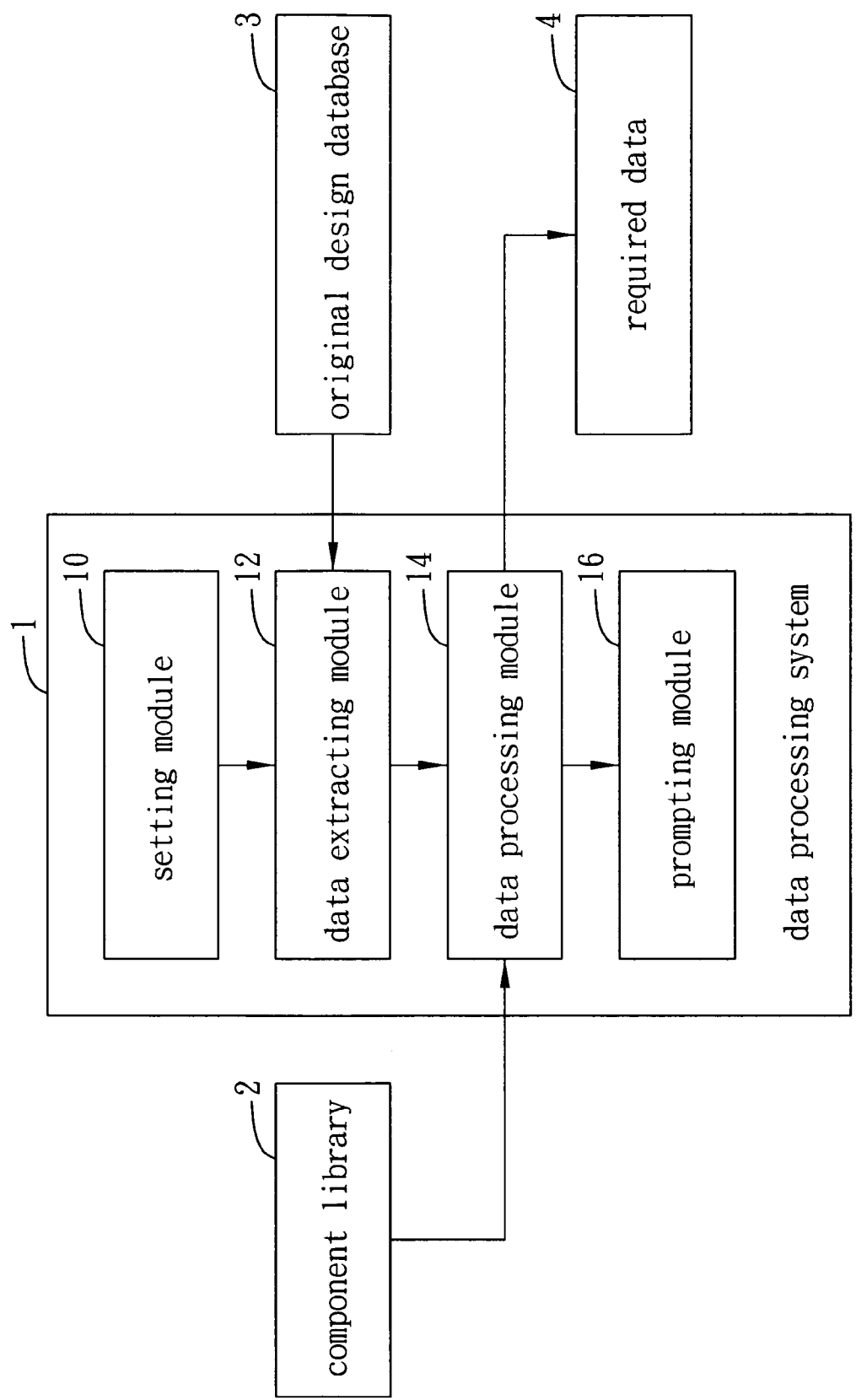
FIG. 2A shows the basic structural block diagram of the data processing system of the present invention.

Please referring to FIG. 2A, shown is a basic structural diagram of the data processing system of the present invention. The data processing system 1 of the present invention is applied to a circuit diagram design of a PCB (Printed Circuit Board). As shown in FIG. 2A, the data processing system 1 is connected to a component library 2 and an original design database 3. The component library 2 stores component data including component attributes and part numbers, wherein the component attributes includes information such as component type, component value, component pins and so on. The component part number is a 12-code internationally interchangeable code. The original design database 3 stores original design data created during circuit diagram design of PCB. The original design data includes data such as pins, nets and component codes that include the part numbers of components on the circuit diagrams.

As shown in FIG. 2A, the data processing system 1 includes: setting module 10, data extracting module 12, data processing module 14 and a prompting module 16.

The setting module 10 allows users to set instructions for data to be extracted. In this embodiment, the setting module 10 is a user-operating interface that enables users to input or select related instructions via the interface.

In this embodiment, the original design data created from the PCB circuit diagram design are divided and stored in three data files: pstchip.dat(pin), pstxnet(net).dat and pstxprt.dat (part). The pstchip.dat(pin) file mainly describes the component pin information; the pstxnet(net).dat file mainly describes net information (i.e. information about signal line electrically connected between various components on the PCB circuit diagram) and pstxprt.dat(part) file mainly describes code information for various components on the PCB circuit diagram, wherein the code information may include component position and part number. In this embodiment, the users may input or select instructions of data to be extracted, for example, pstchip, pstxnet and pstxprt, via the operating interface provided by the setting module 10

The data extracting module 12 is used to extract data such as pins, nets and component codes of components from the original design database 3 corresponding to the instructions inputted by the users via the setting module 12. For example, the data extracting module 12 extracts respective pstchip.dat (pin), pstxnet.dat(net) and pstxprt.dat(part) from the original design database 3 corresponding to instructions pstchip, pstxnet and pstxprt inputted by the users.

The data processing module 14 is used to analyze the data (i.e. component pins, nets, and codes) extracted by the data extracting module 12, obtain related component data from the component library 2 and integrate these data with the related component data from the component library 2 to form data of a certain format required by the user. More particularly, the data processing module 12 analyzes the data in the pstchip.dat (pin) file, the net information in the pstxnet.dat(net) file and the component code information in the pstxprt.dat(part) file, and then associates these data with corresponding component attributes and part numbers in the component library 2.

In this embodiment, the original design data of a PCB circuit diagram are associated with the component attributes and part numbers in the component library 2 by the data processing module 14, which allows the layout engineers to directly perform layout without the need of manually inputting attributes and part numbers of various components on the circuit diagram. Mistakes, such as data misses or extra data added, that often occur during manual input can thus be avoided.

Figure 2B:
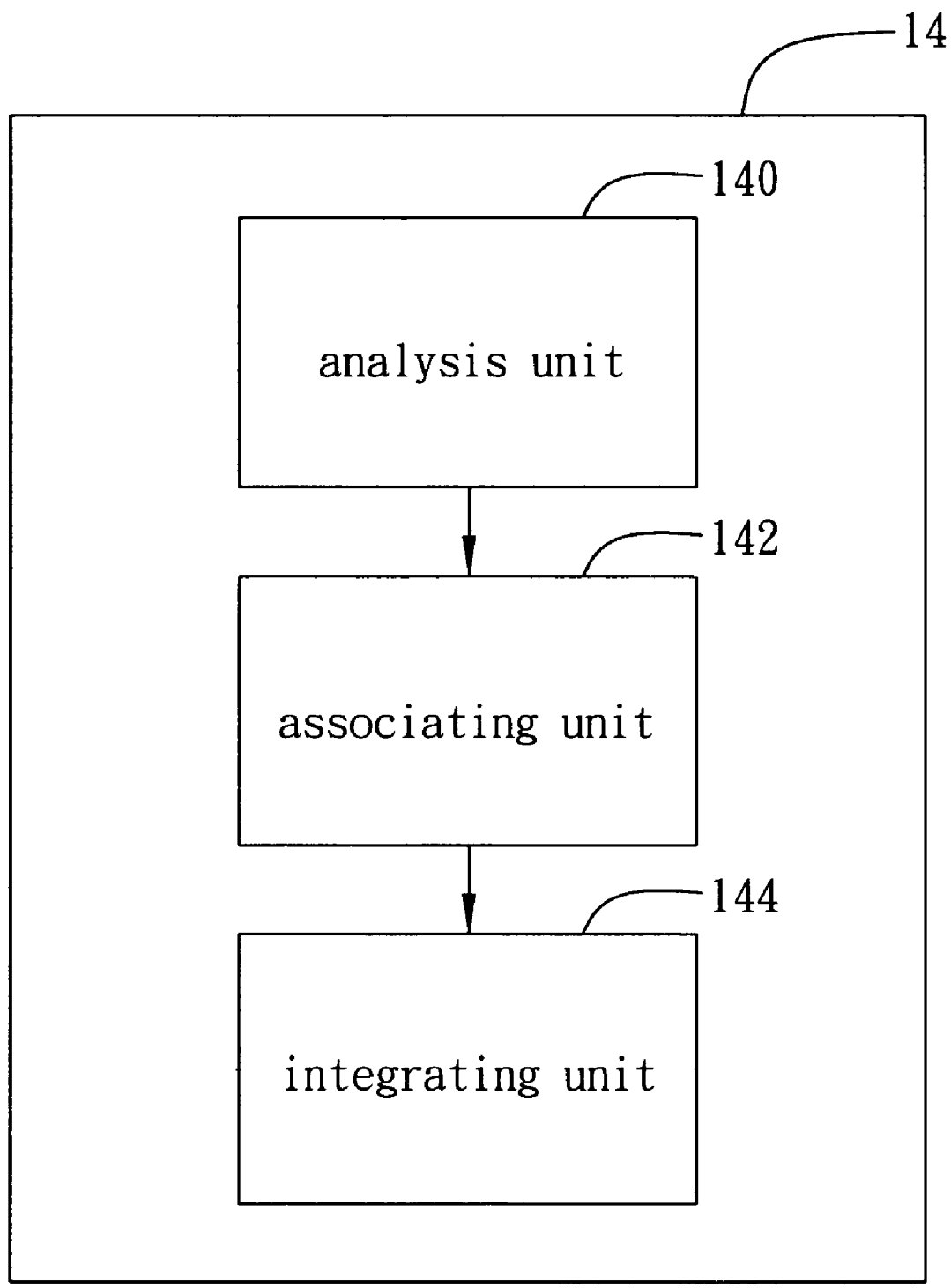
FIG. 2B shows the basic structural block diagram of a data processing module in FIG. 2A.

Referring to FIG. 2B in cooperation, the data processing module 14 includes an analysis unit 140, an associating unit 142 and an integrating unit 144. Details of the analysis unit 140, the associating unit 142 and the integrating unit 144 will now be described.

The analysis unit 140 is used to analyze data (e.g. component pins, nets and component codes) extracted by the data extracting module 12.

The associating unit 142 is used to associate data (e.g. component pins, nets and component codes) extracted by the data extracting module 12 with the corresponding component data (including component attributes and component part number) in the component library 2 based on the analysis result of the analysis unit 140.

The integrating unit 144 is used to integrate data after being associated by the associating unit 142 to form integrated data required by the user.

Now return to FIG. 2A, the prompting module 16 is used to generate a prompt output to the user when the data processing module 14 is unable to associate the data extracted by the data extracting module 12 with the corresponding component attribute data and component part numbers in the component library 2. The user can then be notified of errors in the corresponding component attribute data and/or component part numbers in the component library, such as misses of component attribute data and/or component part numbers, extra data added or wrong data given, that result in failure of association of the data processing module 14.

Figure 3A:
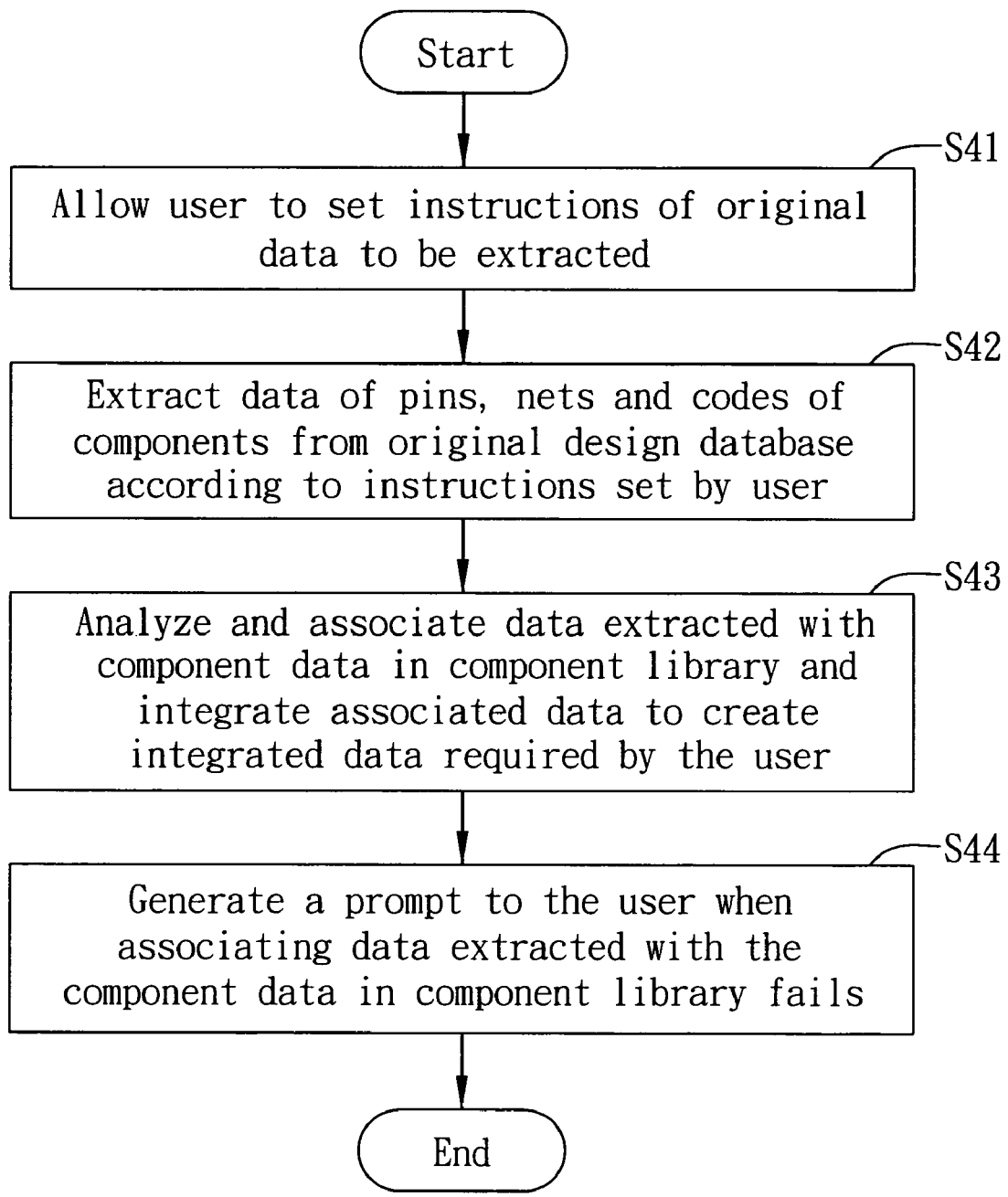
FIG. 3A shows the flow chart of the data processing method of the present invention.

FIG. 3A shows a flow chart of the data processing method performed by the data processing system of the present invention. The data processing method includes steps as follow. In step S41, the user sets instructions for data to be extracted via the setting module 10. Then, go to step S42.

In step S42, information about component pins, nets, and component codes are extracted by the data extracting module 12 from the original design database 3 that corresponding to the instructions inputted by the user via the setting module 10, wherein the component codes includes the component position information and component part numbers. Then, go to step S43.

In step 43, data extracted by the data extracting module 12 are analyzed and associated with the corresponding component data in the component library 2 by the data processing module 14. After association, the data is integrated by the data processing module 14 to form an integrated data required by the user.

Additionally, in this embodiment, the data processing method further includes a step S44. In step S44, a prompt is outputted by the prompting module 16 to the user when the data processing module 14 is unable to associate the data extracted by the data extracting module 12 with the component data in the component library 2. The prompt may indicate that at least an error (e.g. data misses, extra data added or wrong data) occurred in at least one of the component attribute data and component part numbers in the component library 2.

Figure 3B:
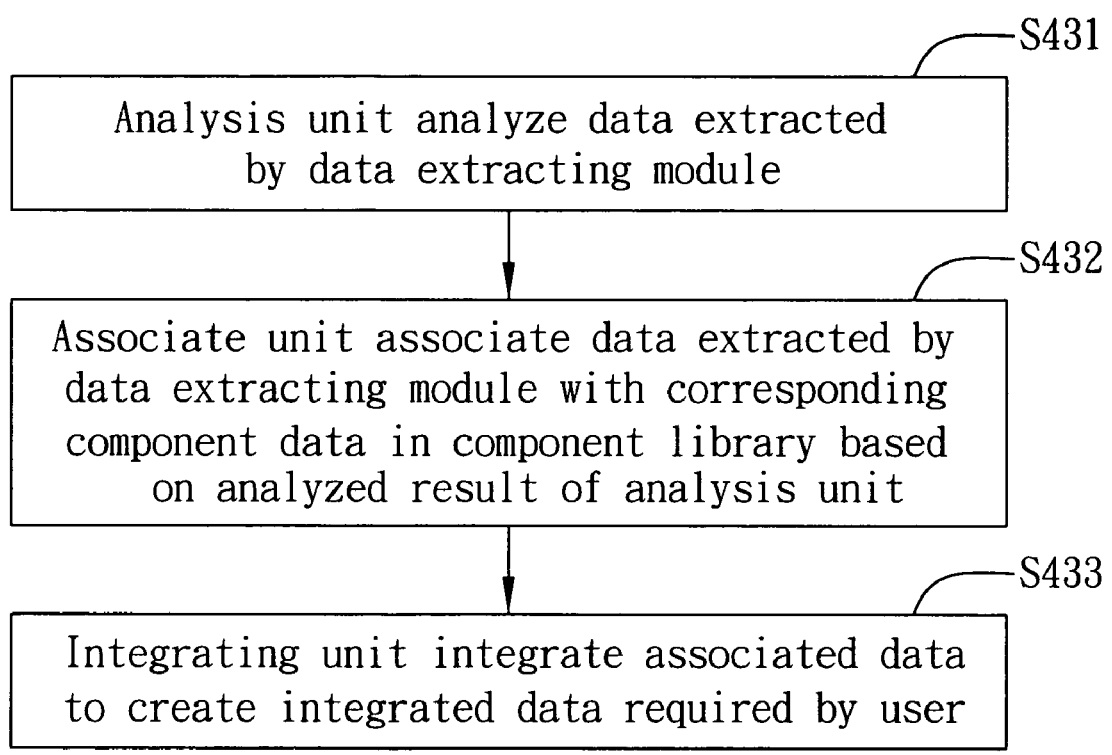
FIG. 3B shows a step S43 in FIG. 3A in more details.

Referring in cooperation to FIG. 3B, which describes the step S43 in more details, in step S431, the data extracted (component pins, nets and component code data) by the data extracting module 12 are analyzed by the analysis module 140. Then, go to step S432.

In step S432, the data extracted (component pins, nets and component code data) by the data extracting module 12 are associated with the corresponding component data in the component library by the associating unit 142 based on the analyzed result of the analysis unit 140. Then, go to step S433.

In step S433, data associated by the associating unit 140 are integrated by the integrating unit 144 to generate an integrated data required by the user, as illustrated in FIG. 4. The integrated data are shown in tabular form, for example. This embodiment shows attribute parameters information of passive components, such as resistors (R), capacitors (C) and inductors (L), in the component library. The attribute parameters may include component type (Type), component value (Value_in_symbol) and component signal model (Signal_model). The component signal model includes information such as component pin counts, part number and so on.

In summary, the present invention realizes a data processing system and method that, without the need to manually input a long list of component descriptions, processes and integrates required data in an efficient manner. Furthermore, the data processing system and method of the present invention eliminates human errors such as data misses, extra data added or wrong data as often happen in the prior art.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A circuit diagram processing system connected with a component library and an original design database, the component library including component data including part numbers and attributes of components, and the original design database storing original design data of components pins, nets and component codes containing part numbers on a circuit diagram, the circuit diagram processing system comprising:
    a setting module for allowing a user to set instructions of the original design data to be extracted;
    a data extracting module for receiving the instructions set by the user and extracting data of pins, nets and codes of components from the original design database according to the instructions;
    a data processing module for analyzing and associating the data extracted by the data extracting module with the corresponding component data in the component library and integrating the associated data to create an integrated data required by the user; and
    a prompting module for generating a prompt to the user when the data processing module is unable to associate the data extracted by the data extracting module with the component data in the component library.

2. The circuit diagram processing system of claim 1, wherein the prompt indicates that at least one error occurs in at least one of the part numbers and attributes of the component data in the component library.

3. The circuit diagram processing system of claim 1, wherein the component attributes include types, values, and pin attributes of the components on the circuit diagram.

4. The circuit diagram processing system of claim 1, wherein the data processing module includes:
    an analysis unit for analyzing the data extracted by the data extracting module;
    an associating unit for associating the data extracted by the data extracting module with the corresponding component data in the component library based on the analyzed result of the analysis unit; and
    an integrating unit for integrating the data after association by the associating unit to create the integrated data required by the user.

5. A circuit diagram processing method applied in a circuit diagram processing system, the circuit diagram processing system being connected with a component library and an original design database, the component library including component data including part numbers and attributes of components, and the original design database storing original design data of pins, nets and codes containing part numbers of components on a circuit diagram, the circuit diagram processing method comprising the steps of:
    allowing a user to set instructions of the original design data to be extracted;
    extracting data of pins, nets and codes of components from the original design database according to the instructions set by the user;
    analyzing and associating the extracted data with the component data in the component library and integrating the associated data to create an integrated data required by the user; and
    generating a prompt to the user when associating the extracted data with the component data in the component library fails.

6. The circuit diagram processing method of claim 5, wherein the prompt indicates that at least one error occurs in at least one of the part numbers and attributes of the component data in the component library.

7. The circuit diagram processing method of claim 5, wherein the component attributes include types, values, and pin attributes of the components on the circuit diagram.

* * * * *